United States Patent [19]

Ruth

[11] 4,220,919
[45] Sep. 2, 1980

[54] CATHODE RAY TUBE DISPLAY ERROR MEASUREMENT APPARATUS AND METHOD

[75] Inventor: Linus C. Ruth, Lancaster, Pa.

[73] Assignee: RCA Corporation, New York, N.Y.

[21] Appl. No.: 958,754

[22] Filed: Nov. 13, 1978

[51] Int. Cl.² ........................................ G01R 31/024
[52] U.S. Cl. .................................. 324/404; 356/372
[58] Field of Search ............... 324/404; 356/372, 384; 350/286, 287; 358/10, 139; 316/1, 23, 27, 29

[56] References Cited

U.S. PATENT DOCUMENTS

| 3,326,079 | 6/1967 | Dyson et al. | 356/384 |
| 3,582,216 | 6/1971 | Edwards | 350/287 |
| 3,587,289 | 6/1971 | Plummer | 350/287 |
| 4,035,834 | 7/1977 | Drury | 324/404 |

Primary Examiner—Michael J. Tokar
Attorney, Agent, or Firm—Eugene M. Whitacre; Paul J. Rasmussen; Joseph J. Laks

[57] ABSTRACT

A color test pattern, such as a crosshatch line pattern, is generated on the phosphor screen of a color cathode ray tube or a color kinescope. A cathode ray tube display error measuring device comprising at least two optical plates, each transmissive to the light emitted by a different color phosphor of the color kinescope is placed adjacent the phosphor screen. One of the optical plates is rotated until the two images of the test pattern formed by the two plates move into alignment with each other. The amount of rotation is a measure of the amount of error present.

11 Claims, 6 Drawing Figures

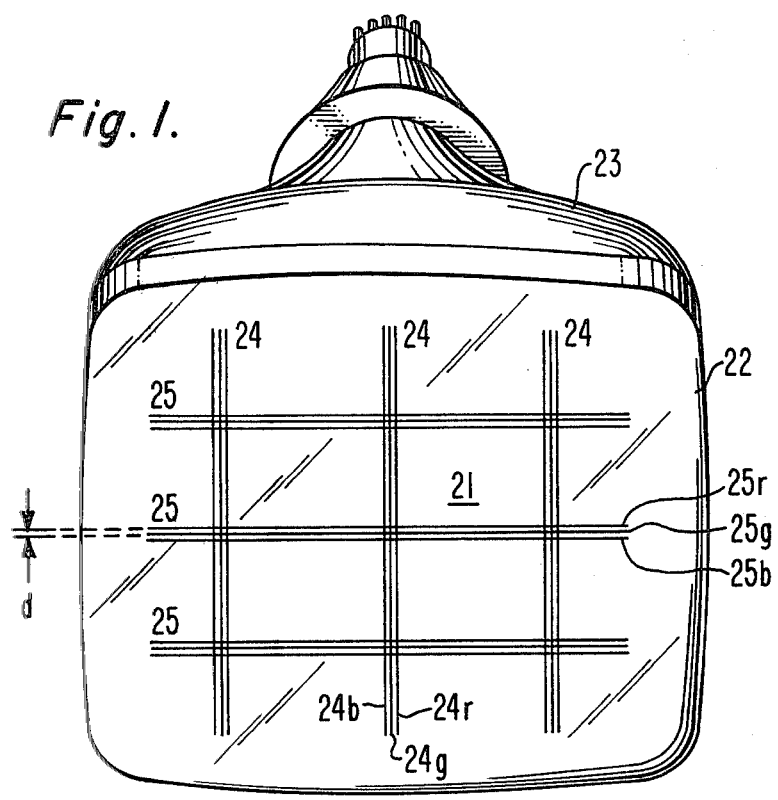
Fig. 1.
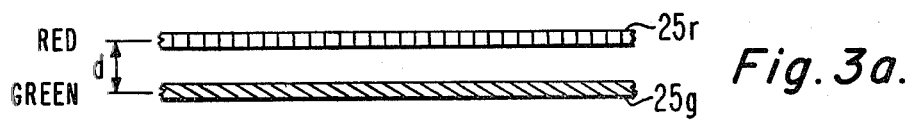
Fig. 3a.
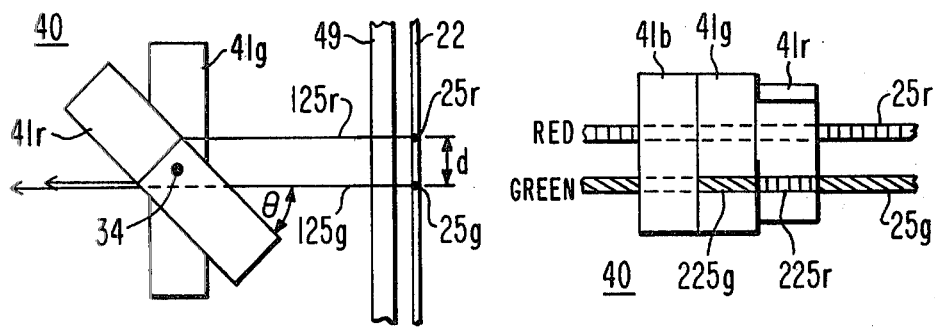
Fig. 3b.
Fig. 3c.

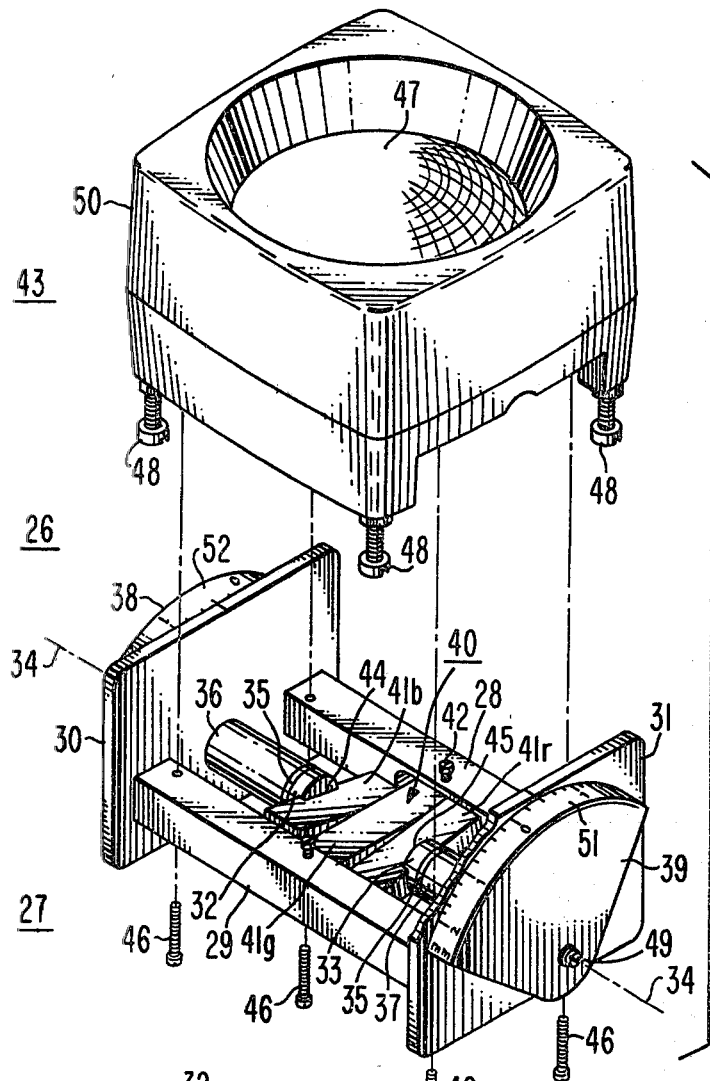
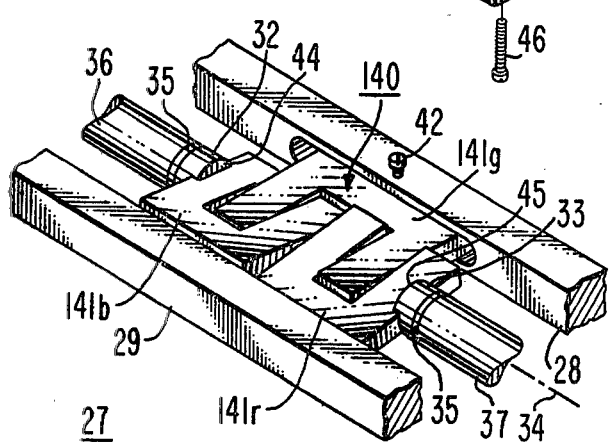

CATHODE RAY TUBE DISPLAY ERROR MEASUREMENT APPARATUS AND METHOD

BACKGROUND OF THE INVENTION

This invention relates to cathode ray tube display error measuring apparatus and methods.

Color kinescopes or cathode ray tubes typically include electron gun structure for generating 3 electron beams which are accelerated by high voltage structure to strike a phosphor screen near the faceplate of the color kinescope. On the phosphor screen are arranged three groups of color phosphors, red, green, and blue phosphors, each of which is excited by its associated electron beam.

Two different arrangements of color phosphors may typically be used. For many delta gun kinescopes, the phosphors are arranged in equilateral triangular dot groups, with a different color phosphor located at an apex of the triangle. For many in-line gun kinescopes, the 3 color phosphors are arranged in groups of three vertical stripes. For both types of arrangements, a suitably designed shadow mask is located in front of the phosphor screen for preventing an electron beam associated with one color phosphor from exciting any of the other 2 color phosphors.

Horizontal and vertical deflection windings, when properly energized, deflect the electron beams to produce a raster on the phosphor screen. Many types of cathode ray tube display errors may occur. Due to such factors as incorrect yoke axial positioning or electron gun misregistration, the deflection centers of the deflected electron beams may not coincide with the deflection centers of the kinescope. Color purity errors will occur. Convergence errors will occur if the beam landing excitation centers of the 3 electron beams are not located within the same color phosphor trio.

Various techniques have been developed to measure the amount of various errors present in a given color kinescope. For example, to measure convergence error in an inline color kinescope, a crosshatch test pattern signal generator is used to generate crosshatched lines on the phosphor screen. Each energized electron gun will produce a crosshatched color line pattern on the phosphor screen. The amount of separation between two different color crosshatch lines is a measure of the misconvergence between the two corresponding electron beams.

Because even relatively large convergence errors may produce relatively small color crosshatch line separations, typical measuring techniques involve the use of microscopes with calibrated viewing scales placed against the kinescope faceplate to measure the crosshatch line separation. Such measuring techniques are relatively cumbersome and are not well-adapted for quickly and accurately measuring convergence errors of a large number of kinescopes, such as may be required in factory quality control programs.

It may also be difficult to accurately measure certain convergence errors. Each electron beam is focussed onto a beam landing spot encompassing several phosphor stripes. To measure the crosshatch line separation of the test pattern requires the relatively difficult task of estimating the distance between the centers of brightness of each of the differently colored crosshatch lines. Furthermore, for relatively small horizontal convergence errors, the vertical crosshatch color lines are relatively closely spaced, resulting, for in-line kinescopes, in the interleaving of a number of differently colored vertical phosphor stripes. Such interleaving further obscures the crosshatch line brightness centers.

SUMMARY

First and second optical imaging structures, transmissive respectively to the light emitted by first and second color phosphors of a color kinescope, are placed adjacent the color kinescope phosphor screen. A color pattern representative of a kinescope display error is generated on the phosphor screen. An adjustment mechanism moves the image of the color pattern formed by the first optical structure into alignment with the image formed by the second optical structure. The amount of adjustment is a measure of the amount of error present.

BRIEF DESCRIPTION OF THE DRAWING

FIG. 1 illustrates a crosshatch test pattern generated on a phosphor screen of a color kinescope;

FIG. 2 illustrates an exploded perspective view of a kinescope display error measuring device embodying the invention;

FIGS. 3 to 3c illustrates color lines of a crosshatch pattern and also illustrates schematically the operation of the measuring device of FIG. 1 by rotation of color plates; and FIG. 4 illustrates a perspective view of part of another kinescope display error measuring device embodying the invention including an optical imaging portion of the device.

DESCRIPTION OF THE INVENTION

Illustrated in FIG. 1 is a test pattern 21 generated on a phosphor screen 22 of a color kinescope or cathode ray tube 23 by a conventional crosshatch test pattern generator, not shown. Test pattern 21 comprises a number of vertical lines 24 and horizontal lines 25 arranged in a conventional crosshatch configuration. Depending on which of the three electron guns of the color kinescope a cathode ray tube is energized, each horizontal and vertical line may also comprise three color lines. A vertical line 24 may comprise respectively blue, green, and red vertical color lines 24b, 24g, and 24r. Similarly, a horizontal line 25 may comprise respectively blue, green, and red horizontal color lines 25b, 25g, and 25r.

If cathode ray tube 23 is subject to display errors such as convergence error, the beam landing centers of the three electron beams of a color phosphor will not be located within the same color phosphor trio. Vertical misconvergence of the red and green electron beams, for example, will result in the horizontal crosshatch color lines 25r and 25g being separated by a distance d, which is a measure of the misconvergence present. Similarly, the separation of any other two vertical or horizontal crosshatch color lines is a measure of a given misconvergence of the corresponding two electron beams.

FIG. 2 illustrates a cathode ray tube display error measuring device 26 embodying the invention, capable of rapidly and accurately measuring display errors such as convergence error. A support housing 27 comprises support bars 28 and 29 attached to end plates 30 and 31. Individually rotatable shafts 32 and 33, located between bars 28 and 29, extend through respective end plates 30 and 31, and have a common axis of rotation 34. Respective bearings 36 and 37 and washers 35 permit smooth rotation of shafts 32 and 33. Rotation knobs 38 and 39 are rigidly attached to respective shafts 32 and 33 by screws 49.

An optical imaging device or assembly 40 is attached to shafts 32 and 33 and to support bars 28 and 29. Optical imaging device 40 comprises three rectangular parallel optical plates 41b, 41g, and 41r. Plate 41b may be formed of a blue colored glass or plastic material which is substantially transmissive in the blue wavelength region of light emitted by the blue color phosphor and is substantially absorptive in the green and red regions of light emitted by the green and red color phosphors. Plates 41g and 41r may similarly be formed of respectively colored green and red glass or plastic. Alternatively, plates 41b, 41g, 41r may be formed of a clear transmissive material, with a respective blue, green, or red filter glued to a surface of a corresponding plate.

Green optical plate 41g is illustratively located between the outer blue and red optical plates 41b and 41r. Green optical plate 41g is fixedly attached to support housing 27 by means of screws 42, and lies parallel to the plane of the support housing. The plate is oriented such that the short dimension or width of the plate is parallel to rotation axis 34.

Blue optical plate 41b is attached to shaft 32 by gluing or press fitting plate 41b across its thickness into a slot 44 formed in one end of the shaft. Similarly attached in a slot 45 formed in one end of shaft 33 is red optical plate 41r. Both the glue and red optical plates 41b and 41r are oriented such that the small dimension or width of the plate is parallel to rotation axis 34.

A magnifying lens assembly 43 is placed over optical imaging assembly 40 and secured to support housing 27 by screws 46. Lens assembly 43 comprises a lens housing 50 into which a magnifying lens 47 is secured. Magnifying lens 47 magnifies the images produced by optical imaging assembly 40 for providing increased viewing ease by the operator by measuring device 26. Adjustable plastic feet 48 are located at the corners of lens housing 50. Plastic feet 48 are rested against the faceplate of a color kinescope and may be adjusted to provide proper offset distance and orientation of optical imaging assembly 40.

To measure cathode ray tube display errors, such as convergence errors, the cathode ray tube is energized. A conventional crosshatch test pattern generator generates a crosshatched color line pattern on the screen of the cathode ray tube. As illustrated in FIG. 3a, by a portion of the crosshatch pattern, if vertical misconvergence between the red and green electron beams, for example, is present, a red horizontal crosshatch line 25r will be separated from the green horizontal crosshatch line 25g by a distance d. Cathode ray tube display error measuring device 26 is then placed against the faceplate of the cathode ray tube.

As illustrated in the partially schematic side view of FIG. 3b, support housing 27, not illustrated, locates optical imaging assembly 40 sufficiently far away from faceplate 49 to permit unencumbered rotation of optical plates 41b, 41g, 41r about rotation axis 34. Measuring device 26 is then oriented so that rotation axis 34 is directed parallel to horizontal lines 25r and 25g and so that the nonrotatable green optical plate 41g is approximately parallel to phosphor screen 22.

As illustrated in FIGS. 3b and 3c, when green crosshatch line 25g is viewed by an operator along a line generally normal to a light ray 125g, or to faceplate 49, an optical image 225g of horizontal green line 25g, undisplaced in the vertical direction, is formed by green optical plate 41g. If the operator rotates red optical plate 41r by rotating knob 39 and shaft 33 of FIG. 2 through an angle $\theta$, a vertically displaced optical image 225r of horizontal red crosshatch line 25r is formed by red optical plate 41r. This displacement is caused by refraction at the optical surfaces of red plate 41r of light rays, such as ray 125r, emanating from red crosshatch line 25r.

The operator adjusts measuring device 26 by rotating knob 39 until the red and green images 225r and 225g move into alignment, as illustrated in FIG. 3c. The amount of rotation $\theta$ is a function of the separation or displacement d of the red and green horizontal lines and is a measure of the existing vertical misconvergence. The displacement d may be read directly from the appropriate one of the two graduated and calibrated scales 51 and 52 placed on rotation knobs 38 and 39 and illustrated in FIG. 2. Similar techniques of aligning the appropriate optical images are used when measuring the misconvergence of any other pair of electron beams.

If horizontal misconvergence is to be measured, for example, the vertical lines 24 of the crosshatch pattern 21 of FIG. 1 are used, and the horizontal displacement of any two vertical color crosshatch lines is measured. Cathode ray tube display error measuring device 26 is oriented on faceplate 49 such that rotation axis 34 is parallel to the vertical lines 24. The appropriate knobs are turned until the appropriate two optical images are in alignment. The amount of displacement, indicative of the amount of misconvergence, is then read or computed using scales 51 and 52.

As illustrated in FIG. 3c, because green plate 41g is nontransmissive in the red, and red plate 41r is nontransmissive in the green, no optical image of red line 25r is formed by green plate 41g and no optical image of green line 25g is formed by red plate 41r. For similar reasons, no optical image of either red line 25r or green line 25g is formed by blue optical plate 41b.

FIG. 4 illustrates a portion of a cathode ray tube display error measuring device 26 embodying the invention, that includes a different configuration for the optical imaging device. In FIG. 4, an optical imaging device 140 comprises three U-shaped optical plates 141b, 141g, 141g, 141r rather than rectangular shaped plates of optical imaging device 40 of FIG. 2. One leg of the blue U-shaped plate 141b is fitted into slot 44 of shaft 32 and one leg of the red U-shaped plate 141r is fitted into slot 45 of shaft 33. Both plates are rotatable about axis 34. The green U-shaped plate 141g is fixedly attached to support bar 28 by means of screw 42.

Using optical imaging device 140 of FIG. 4, the misconvergence of the red and blue beams may be measured by aligning blue and red image lines that are located side-by-side without any intervening blank space where no image is formed. Using optical image device 40 of FIG. 2 to measure blue to red misconvergence, a blank space exists when viewing across the green rectangular plate 41g, because green plate 41g is nontransmissive in the blue and red phosphor wavelength region. Alignment of the blue and red crosshatch line images is therefore made slightly easier with the imaging device 140 of FIG. 4.

The use of filtered glass or plastic material produces relatively sharp crosshatch line images thereby facilitating image alignment. The width of each rectangular plate 41b, 41g, 41r and the width of each leg of each U-shaped plate 141b, 141g, 141r should be relatively small, bout 6 mm. wide, for example, to further facilitate measuring convergence errors away from the center of the raster where the crosshatch lines may be curved rather straight. The thickness of each plate may be on the order of 5 to 6 mm., depending on, for example, the desired scale lengths.

Using the inventive concepts above described, measurement of display errors other than convergence errors may be made. For example, for some nonmatrix type color cathode ray tubes, the shadow mask aperture width may be considerably less than the individual phosphor stripe widths. The phosphor screen landing spot widths of the electron beams will also be less than the phosphor stripe widths. If color purity errors exist in such type of cathode ray tubes, then the centers of the electron beam landing spots for a given color will be centered on its associated color phosphor stripe.

A cathode ray tube display measuring device 26 similar in functioning to that of FIG. 1 or FIG. 4, may be used to measure color impurity, such as red impurity. A test pattern, such as conventional red raster, or red lines, is generated on the cathode ray tube phosphor screen. Measuring device 26 is then placed on the faceplate with rotation axis 34 parallel to the vertical phosphor stripes. The image formed by a first optical plate of optical imaging assembly 40 of the red beam landing position of a selected vertical scan line is observed through magnifying lens 43. This optical plate is transmissive in the red phosphor wavelength region. Also observed is the image formed by a second optical plate of optical imaging assembly 40 of the adjacent red phosphor stripe. The second optical plate is also transmissive in the red region. Alternatively, this plate may be formed of clear glass. The displacement of the red beam landing spots in the vertical direction from their nominal positions centered on the associated red phosphor stripe is representative of the amount of red color impurity. The amount of displacement may be measured by rotating the first optical plate of optical imaging assembly 40 until the two images are aligned.

Appropriate design modification of measuring device 26 may be required, such as width and thickness changes for the optical plates of optical imaging assembly 40. A larger magnification for magnifying lens 47 may also be required. Rotation knobs 38 and 39 may be replaced by calibrated vernier micrometer assemblies for accurate reading of small rotation angles.

What is claimed is:

1. A cathode ray tube display error measuring device, comprising:
   a support housing suitable for placing adjacent a phosphor screen of a color cathode ray tube;
   first optical means located on said support housing transmitting the light emitted by a first color phosphor group of said color cathode ray tube;
   second optical means transmitting the light emitted by a second color phosphor group of said color cathode ray tube; and
   adjustment means coupled to one of said first and second optical means for moving the image of a test pattern generated on said phosphor screen formed by said first optical means into alignment with the image of said test pattern formed by said second optical means.

2. A measuring device according to claim 1 wherein said first and second optical means comprises respectively first and second rectangular parallel plates.

3. A measuring device according to claim 1 wherein said adjustment means rotates one of said rectangular parallel plates about an axis parallel to the width of said one plate.

4. A measuring device according to claim 1 wherein said first and second optical means comprise first and second U-shaped plates respectively.

5. A measuring device according to claim 4 wherein said adjustment means rotates one of said U-shaped plates about an axis parallel to the width of a leg of said one plate.

6. A method of measuring convergence error in a color kinescope, including at least first and second electron beams and an arrangement of first and second color phosphors excited respectively by said first and second electron beams, said first and second phosphors located adjacent a phosphor screen of said color kinescope, comprising the steps of:
   generating first and second color line patterns on said phosphor screen, the separation of said first and second line patterns representative of said convergence error;
   placing adjacent said phosphor screen an optical device which creates respectively first and second images of said first and second line pattern; and
   adjusting said optical device until said first and second images move into alignment, the amount of adjustment being a measure of said convergence error.

7. A method according to claim 6 wherein said optical device comprises first and second optical plates, each transmissive to the light emitted by a different one of said first and second color phosphors.

8. A method according to claim 7 wherein said adjusting step comprises the step of rotating said first plate relative to said second plate until said first and second images move into alignment.

9. A method according to claim 8 wherein said first and second optical plates comprise first and second rectangular parallel plates respectively.

10. A method according to claim 8 wherein said first and second optical plates comprise first and second U-shaped plates respectively.

11. A method of measuring display error in a kinescope, comprising the steps of:
   generating a test pattern on a phosphor screen of said kinescope, the displacement of said test pattern from its nominal position representative of said display error;
   placing adjacent said phosphor screen an optical device which creates respectively first and second images of said test pattern; and
   adjusting said optical device until said first and second images move into alignment, the amount of adjustment being a measure of said display error.

* * * * *

UNITED STATES PATENT AND TRADEMARK OFFICE
CERTIFICATE OF CORRECTION

PATENT NO. : 4,220,919

DATED : September 2, 1980

INVENTOR(S) : LINUS C. RUTH

It is certified that error appears in the above-identified patent and that said Letters Patent is hereby corrected as shown below:

Column 5, line 15, after "will" insert -- not --.

Signed and Sealed this

Sixteenth Day of December 1980

[SEAL]

Attest:

SIDNEY A. DIAMOND

Attesting Officer

Commissioner of Patents and Trademarks